(12) United States Patent
Noble et al.

(10) Patent No.: US 7,499,274 B2
(45) Date of Patent: Mar. 3, 2009

(54) METHOD, APPARATUS AND SYSTEM FOR ENCLOSURE ENHANCEMENT

(75) Inventors: Scott Noble, Beaverton, OR (US); Seri Lee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 156 days.

(21) Appl. No.: 11/450,215

(22) Filed: Jun. 8, 2006

(65) Prior Publication Data

US 2007/0285891 A1    Dec. 13, 2007

(51) Int. Cl.
*H05K 7/20* (2006.01)
*F28F 7/00* (2006.01)

(52) U.S. Cl. .............. 361/690; 165/80.2; 165/80.3; 165/80.4; 165/185; 361/699; 361/704; 361/708; 361/715

(58) Field of Classification Search ............... None
See application file for complete search history.

(56) References Cited

U.S. PATENT DOCUMENTS

| | | | |
|---|---|---|---|
| 5,175,613 A * | 12/1992 | Barker et al. ............... 257/713 |
| 5,419,780 A * | 5/1995 | Suski ........................ 136/205 |
| 5,513,070 A | 4/1996 | Xie et al. |
| 5,621,613 A | 4/1997 | Haley et al. |
| 5,718,282 A | 2/1998 | Bhatia et al. |
| 5,880,929 A | 3/1999 | Bhatia |
| 6,108,204 A * | 8/2000 | Brotherton et al. .......... 361/704 |
| 6,992,891 B2 * | 1/2006 | Mallik et al. ................ 361/704 |
| 7,086,452 B1 * | 8/2006 | Senyk et al. ............... 165/80.4 |
| 7,190,585 B2 * | 3/2007 | Houle ........................ 361/704 |
| 2003/0183379 A1 * | 10/2003 | Krassowski et al. ......... 165/185 |
| 2004/0070070 A1 * | 4/2004 | Sung .......................... 257/706 |
| 2006/0272803 A1 * | 12/2006 | Senyk et al. ................ 165/287 |

OTHER PUBLICATIONS

U.S. Appl. No. 09/608,688; Title: Ergonomic Heat Sink; Inventor: Seri Lee; filed Jun. 29, 2000.

* cited by examiner

*Primary Examiner*—Gregory D Thompson
(74) *Attorney, Agent, or Firm*—Kacvinsky LLC

(57) ABSTRACT

In some embodiments, a method, apparatus and system are described for enhancing an enclosure of a device, such as a computing device. The system may include a frame and an apparatus, wherein the apparatus includes the enclosure, which may form a cover of a computing device, and a base. In some embodiments, the enclosure may be composed of materials with different thermal properties when compared to the base. In some embodiments, the enclosure may include vents or openings of various configurations. In some embodiments, the base may be a heat spreader or a heat sink. Other embodiments may be described.

10 Claims, 9 Drawing Sheets

METHOD, APPARATUS AND SYSTEM FOR ENCLOSURE ENHANCEMENT

BACKGROUND

1. Technical Field

Some embodiments of the present invention generally relate to cooling systems. More specifically, some embodiments relate to an apparatus, system and method for enhancing enclosures of devices capable of generating thermal energy.

2. Discussion

In recent years, power dissipation from computing devices has become more problematic as the speed and complexity of integrated circuits have increased. Furthermore, the enclosure shape of the computing devices has become increasingly important, especially for consumer products where the device is handled more frequently, for example, in the use of mobile or handheld devices. Consequently, it has become essential to have enclosures that have more comfortable surface temperatures.

Therefore, there is a need for alternative enclosures which enhance cooling of the computing devices and offer improved surface characteristics.

BRIEF DESCRIPTION OF THE DRAWINGS

Various advantages of embodiments of the present invention will become apparent to one of ordinary skill in the art by reading the following specification and appended claims, and by referencing the following drawings, in which:

DETAILED DESCRIPTION OF SOME EMBODIMENTS

Reference is made to some embodiments of the invention, examples of which are illustrated in the accompanying drawings. While the present invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims. Moreover, in the following detailed description of the invention, numerous specific details are set forth in order to provide a thorough understanding of the invention. However, the invention may be practiced without these specific details. In other instances, well-known methods, procedures, components and circuits have not been described in detail as not to unnecessarily obscure aspects of the invention.

Some embodiments of the invention are directed to a method, apparatus and system for enhancing enclosures for computing devices. The system may include a frame and an apparatus, wherein the apparatus includes the enclosure, which may form a cover of a computing device, and a base. In some embodiments, the enclosure may be composed of materials with different thermal properties when compared to the base. In some embodiments, the enclosure may include vents or openings of various configurations. In some embodiments, the base may be a heat spreader or a heat sink.

According to some embodiments, the enclosure may be separated from the base by one or more stubs. The stubs, in some embodiments, may be used to increase or decrease the distance between the enclosure and the base.

Reference in the specification to "one embodiment" or "some embodiments" of the invention means that a particular feature, structure or characteristic described in connection with the embodiment is included in at least some embodiments of the invention. Thus, the appearances of the phrase "in some embodiments" or "according to some embodiments" appearing in various places throughout the specification are not necessarily all referring to the same embodiment.

Figure 1A:
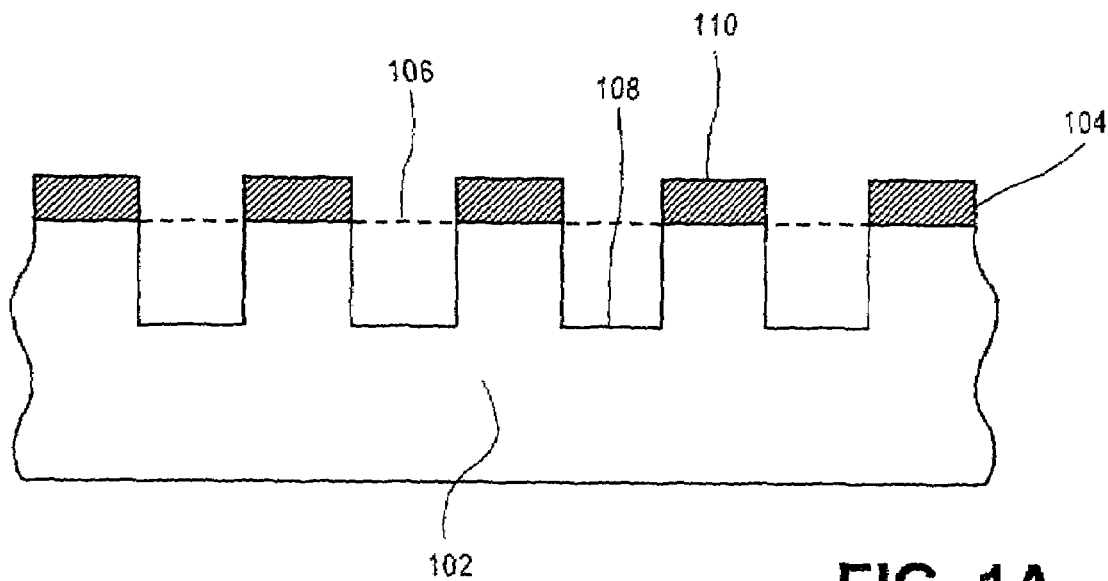
FIG. 1A is a cross-sectional elevation view of fins of a base where the ends of the fins are fabricated from a lower thermal conductivity material according to some embodiments of the invention.

FIG. 1A is a cross-sectional elevation view of fins 104 of a base 102 where the ends 110 of the fins 104 are fabricated from a lower thermal conductivity material in accordance with some embodiments of the invention. In some embodiments, the material may form an enclosure, as described and illustrated elsewhere herein. In some embodiments, the material may be a composition, including graphite, plastic, silica, or equivalent materials. In some embodiments, the thickness of the material may extend a distance of about a few millimeters or more above the plane 106 of the fins. In some embodiments, the height 108 of the fins may range from about a millimeter to a centimeter. As one of ordinary skill in the relevant art would appreciate based at least on the teachings provided here, the height 108 of the fins may not be constant over the entire system.

The surface temperature of the enclosure may also be referred to as the skin temperature of the surface, which in some embodiments may be maintained at a temperature that can be comfortably touched and below that of the base which includes the base 102. As described elsewhere herein, when the base 102 is near the surface of the computing device, the composition of the enclosure may be more essential to maintaining the ergonomics of the device, with respect to some embodiments.

In some embodiments, the base 102 may include a heat sink with a plurality of parallel spaced-apart fins 104. In some embodiments, the configuration of the fins may be altered or absent, as in FIG. 1B below. Furthermore, and without restriction, the base 102 may use pin or waffle fins or other types of equivalent structures, as one of ordinary skill in the relevant art would appreciate based at least on the teachings provided herein. Furthermore, the term "array of fins" may be used to describe the fin structures, particularly, where the distance between the fins may be small enough so that the sides of the fins are aligned with the openings in the enclosure, as shown in FIG. 1A.

For example, as shown in FIG. 1A, the base 102 may dissipate thermal energy, also referred to as heat, through a plurality of fins 104 by both convective heat transfer into an external fluid, such as but not limited to air, water, ethylene, propylene, glycol, a mixture of these, or equivalent substances, as well as through irradiative transfer into the surrounding environment. As such, in some embodiments, the base 102 may be mounted on or be an integral part of a computing system, as described in greater detail elsewhere herein. In such cases, the exact configuration of the base 102 may be altered to allow it to be implemented in the particular computing system, as one of ordinary skill in the relevant art would appreciate based at least on the teachings provided herein.

Figure 1B:
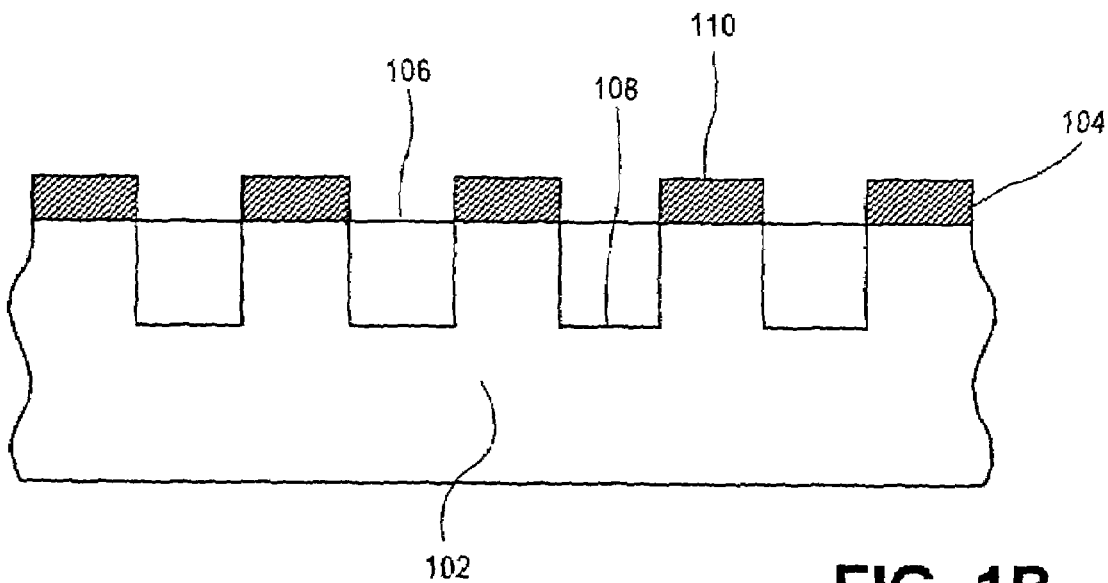
FIG. 1B is a cross-sectional elevation view of a base where fins are fabricated from a lower thermal conductivity material according to some embodiments of the invention.

In some embodiments, such alterations may be embodied by the apparatus shown in FIG. 1B. Here, a cross-sectional elevation view of the base 102 is shown, where the fins 104 are fabricated entirely from a lower thermal conductivity material.

Figure 2:
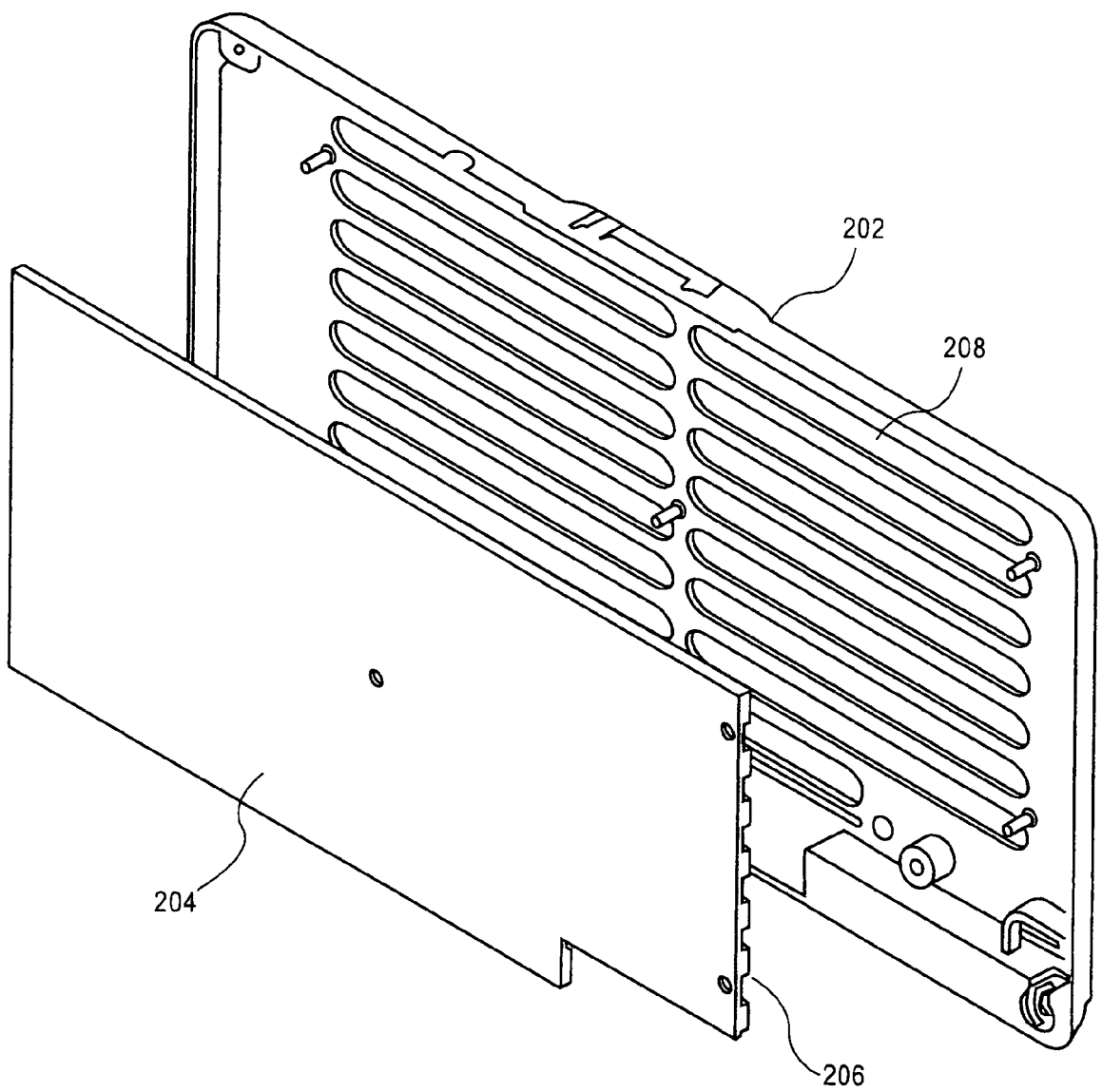
FIG. 2 is a perspective view of an apparatus with base and enclosure cover according to some embodiments of the invention.

FIG. 2 is a perspective view of an apparatus 200 with base 204 and enclosure 202 according to some embodiments of the invention. The apparatus 200 may include a base 204 of a first composition of material. The composition may include metals or alloys, graphite, plastic, silica, or equivalent materials. In some embodiments, the base 204 may be in thermal contact with a component, such as an electronic component (not shown), which may be capable of generating heat. In some embodiments, the component may be a processor, a chipset, a display, or a power adapter or equivalent heat-generating component requiring cooling, as one of ordinary skill in the relevant art would appreciate based at least on the teachings provided herein. According to some embodiments of the invention, the base 204 may be a heat spreader or a heat sink or equivalent thermal component.

The apparatus 200 may also include an enclosure 202 of a second composition of material. In some embodiments, the second composition may include metals or alloys, graphite, plastic, silica, or equivalent materials. In some embodiments, the enclosure 202 may be in proximity with the base 204. In some embodiments, the second composition may have a lower thermal conductivity than the first composition, and therefore not transfer thermal energy, also referred to as heat, as well as the first composition.

In some embodiments of the invention, the base 204 may include one or more raised fins 206. As described with respect to FIG. 1, the fins 206 may aid in the transfer of thermal energy from the base 204. Furthermore, in some embodiments of the invention, an array of one or more vents 208 may be formed in the enclosure 202. In some embodiments, the vents 208 may provide for the transfer of thermal energy from the base 204 to a fluid (not shown), which in may permeate the enclosure 202 at the vents 208 to make thermal contact with the base 204.

In some embodiments, the vents of the array may be integrally formed with the enclosure. Furthermore, in some embodiments, the shapes of the vents may be angled, curved, louvered, sinusoidal, flapped, corrugated, separated posts, a combination of these shapes, or a combination of variations of the same shape.

In some embodiments, the fluid may be air, water, ethylene, propylene, glycol or equivalent fluid that may be used to transfer thermal energy from the base 204.

Figure 3:
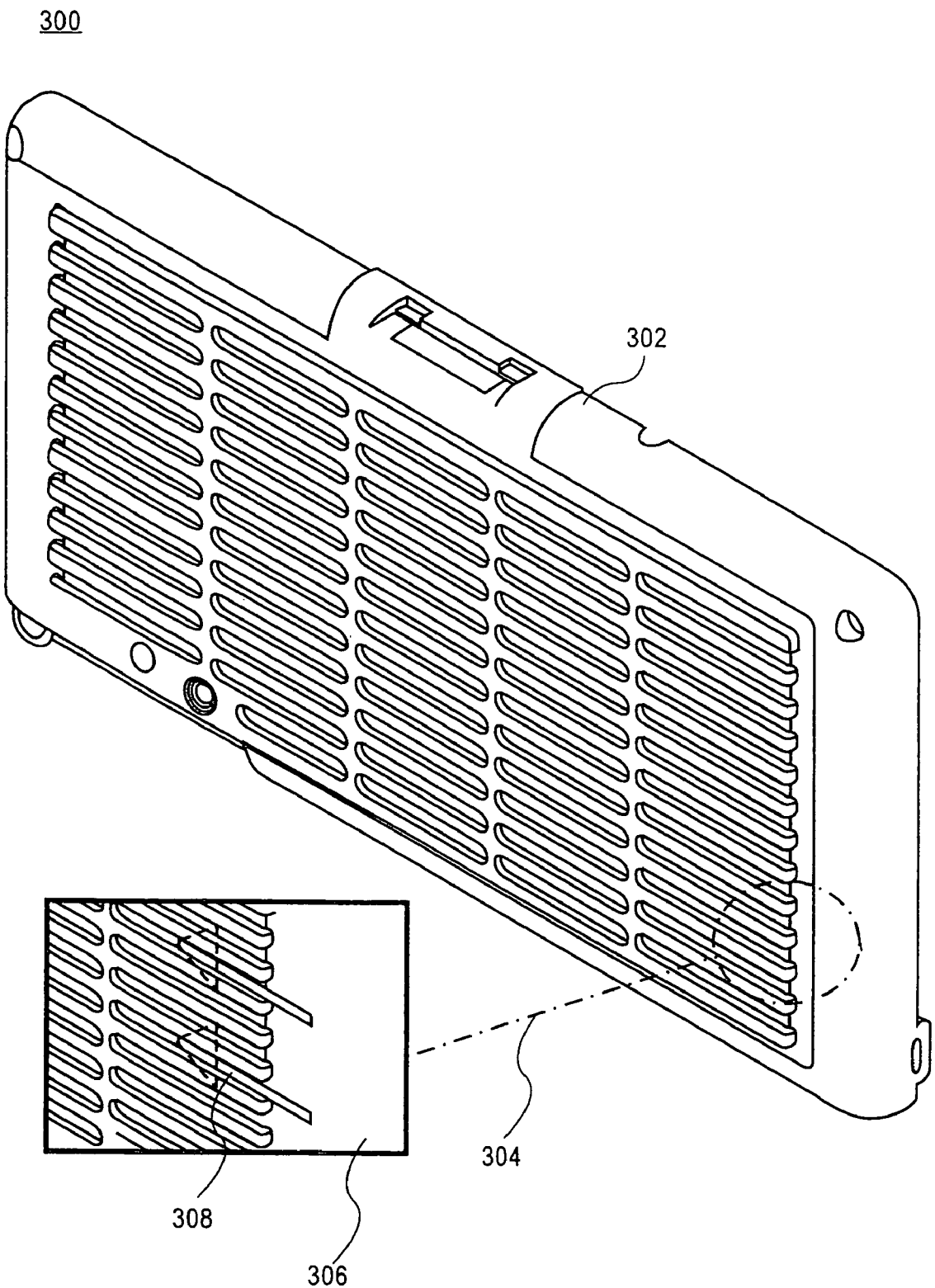
FIG. 3 is a perspective view of an apparatus according to some embodiments of the invention.

The flow of the fluid is illustrated in FIG. 3. FIG. 3 is a perspective view of an apparatus 300 according to some embodiments of the invention. Inset 304 shows an enclosure 302 with a surface 306 with vents, and the directional flow 308 of the fluid, according to some embodiments of the invention.

Figure 4:
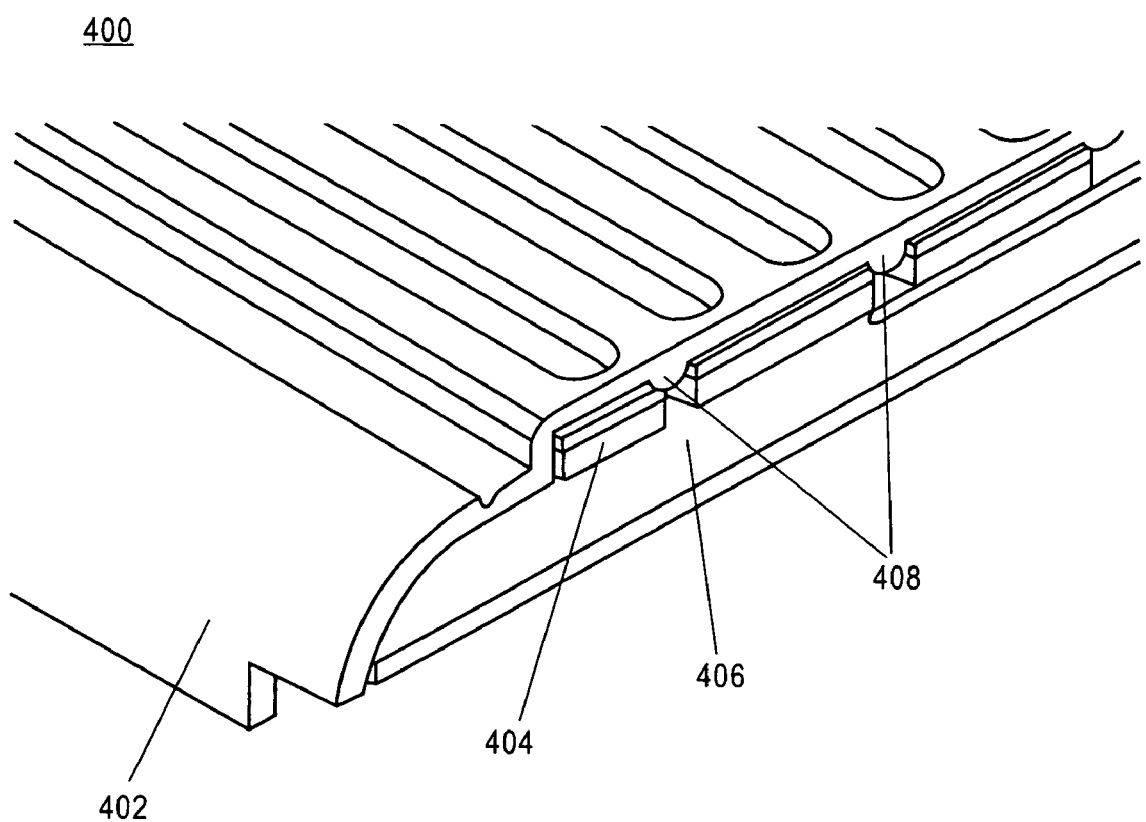
FIG. 4 is a cross-sectional diagram of an apparatus according to some embodiments of the invention.

FIG. 4 is a cross-sectional diagram of an apparatus 400 according to some embodiments of the invention. The apparatus 400 may include an enclosure 402 with one or more stubs 408. The stubs 408 may minimize thermal contact with a base 404, which may be a heat sink or heat spreader. Furthermore, the base 404 may be in thermal contact with a component 406, where the component 406 may be capable of generating heat.

In some embodiments, the one or more stubs 408 may be positioned between the base 404 and the enclosure 402 to separate the base 404 from the enclosure 402. Moreover, the one or more stubs 408 may be positioned to reduce the transfer of thermal energy from the base 404 to the enclosure 402, in some embodiments. According to some embodiments, the one or more stubs 408 may be positioned to increase the separation of the base 404 from the enclosure 402. In some embodiments the one or more stubs 408 may be adjustable in height to accomplish both the increasing and decreasing of separation between the base 404 and the enclosure 402. In some embodiments, the height may be adjusted by an actuator or other mechanism.

Figure 5:
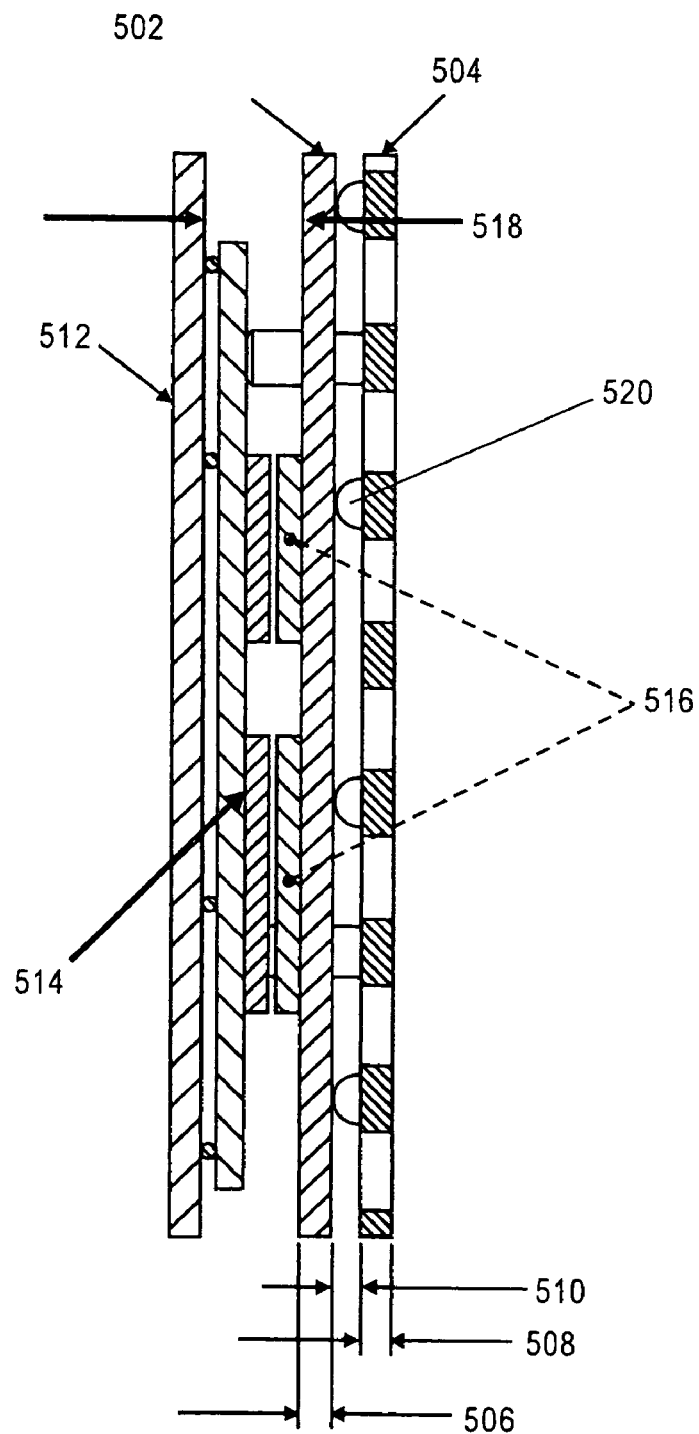
FIG. 5 is a cross-sectional diagram of an apparatus according to some embodiments of the invention.

FIG. 5 is a cross-sectional diagram of an apparatus 500 according to some embodiments of the invention. The apparatus 500 may include a base 502 and an enclosure 504. In some embodiments, the base 502 may be a heat sink or a heat spreader, and as described elsewhere herein, may be composed of a metal or other thermally conductive material. Also, in some embodiments, the enclosure 504 may be in thermal contact with base 502 in some manner. In some embodiments, the enclosure 504 may be in very minimal thermal contact with the base 502 via the use of one or more stubs 520. The stubs 520 may create a gap 510 between the base 502 and the enclosure 504. In some embodiments, the gap 510 may be increased in width. In some embodiments, the gap 510 may be a few centimeters, a few millimeters, or zero (direct contact).

In some embodiments, the base 502 may have a thickness 506 of about a millimeter, more or less, as one of ordinary skill in the art would appreciate based at least on the teachings provided herein. The enclosure 504 may be of a similar thickness, as denoted by 508. In some embodiments of the invention, the apparatus 500 may, therefore, be a distance 518 from an electronic component 514. In some embodiments, the electronic component 514 may be thermally coupled to the base 502 by a thermal interface material (TIM) 516, as one of ordinary skill in the relevant art would appreciate based at least on the teachings described herein. In some embodiments, the electronic component 514 may be coupled to a backing 512, such as, but not limited to, a printed circuit board (PCB).

Figure 6:
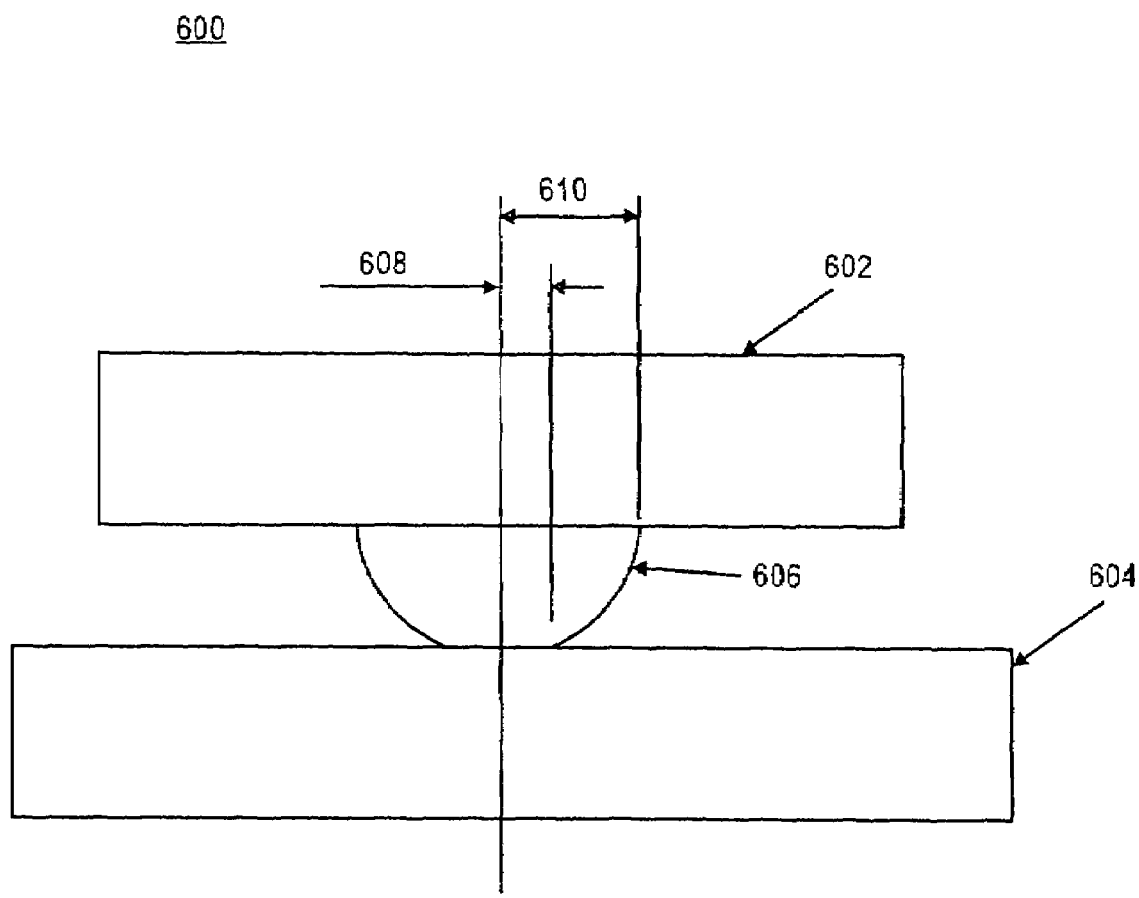
FIG. 6 is a cross-sectional diagram of a stub according to some embodiments of the invention.

FIG. 6 is a cross-sectional diagram of a stub according to some embodiments of the invention. The apparatus 600 may include a stub which is in thermal contact with a base 604. In some embodiments, the stub may include a hemispherical dimple 606. The hemi-spherical dimple 606 may have an inner feature 608 and an outer feature 610, as shown. In some embodiments, these features may define the contact between the base 604 and an enclosure 602, as one of ordinary skill in the art would appreciate based at least on the teachings provided herein.

Figure 7:
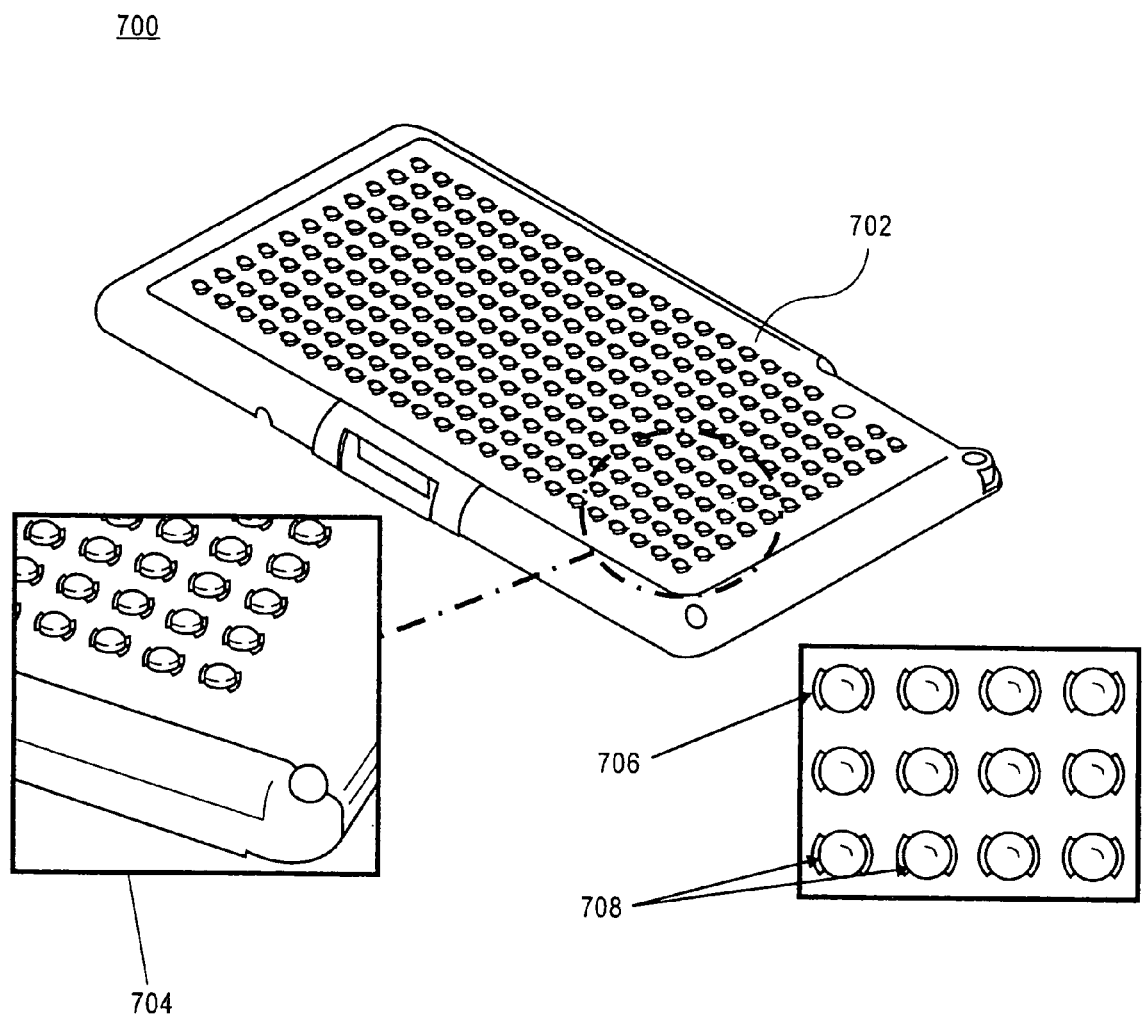
FIG. 7 is a perspective view of an enclosure according to some embodiments of the invention.

FIG. 7 is a perspective view of an enclosure 700 according to some embodiments of the invention. In some embodiments, the enclosure 700 may have a surface 702 (shown in greater relief in inset 704) with angled vents 708 set at the base of one or more surface features 706. As one of ordinary skill in the relevant art would appreciate based at least on the teachings provided herein, the angled vents 708 may be shaped differently.

Figure 8:
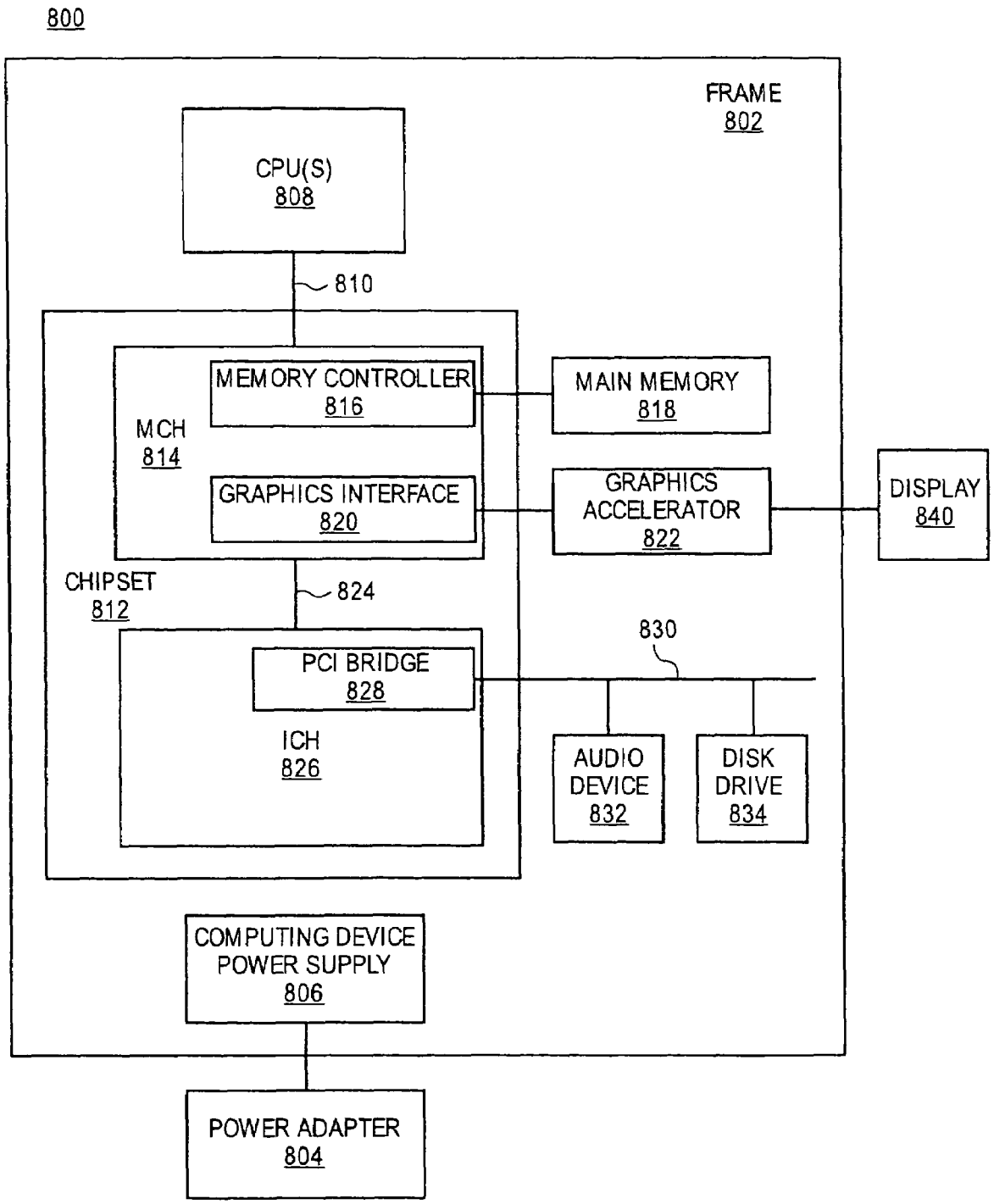
FIG. 8 is a schematic illustration of a computer system according to some embodiments of the invention.

FIG. 8 is a schematic illustration of a computer system 800 according to some embodiments of the invention. The system 800 may include a frame 802, and a base of a first composition, where the base may make thermal contact with a component, such as, but not limited to, the components of the system 800 described below. Moreover, in some embodiments, the frame 802 may include an enclosure of a second composition in proximity with the base, where the second composition has a lower thermal conductivity than the first composition, and where the enclosure covers the frame 802.

In some embodiments, the apparatuses described above may be implemented in the computer system 800. In some embodiments, the frame 802 may be a computing device in the form of a mobile computer, a desktop computer, a server computer, or a handheld computer.

The computer system 800 may also include a power adapter 804 (e.g., to supply electrical power to the computing device 802). The computing device 802 may be any suitable computing device such as a laptop (or notebook) computer, a personal digital assistant, a desktop computing device (e.g., a workstation or a desktop computer), a rack-mounted computing device, and the like.

Electrical power may be provided to various components of the computing device 802 (e.g., through a computing device power supply 806) from one or more of the following sources: one or more battery packs, an alternating current (AC) outlet (e.g., through a transformer and/or adaptor such as a power adapter 804), automotive power supplies, airplane power supplies, and the like. In some embodiments, the power adapter 804 may transform the power supply source output (e.g., the AC outlet voltage of about 110VAC to 240VAC) to a direct current (DC) voltage ranging between about 7VDC to 12.6VDC. Accordingly, the power adapter 804 may be an AC/DC adapter.

The computing device 802 may also include one or more central processing unit(s) (CPUs) 808 coupled to a bus 810. In some embodiments, the CPU 808 may be one or more processors in the Pentium® family of processors including the Pentium® II processor family, Pentium® III processors, Pentium® IV processors available from Intel® Corporation of Santa Clara, Calif. Alternatively, other CPUs may be used, such as Intel's Itanium®, XEON™, and Celeron® processors. Also, one or more processors from other manufactures may be utilized. Moreover, the processors may have a single or multi core design.

A chipset 812 may be coupled to the bus 810. The chipset 812 may include a memory control hub (MCH) 814. The MCH 814 may include a memory controller 816 that is coupled to a main system memory 818. The main system memory 818 stores data and sequences of instructions that are executed by the CPU 808, or any other device included in the system 800. In some embodiments, the main system memory 818 includes random access memory (RAM); however, the main system memory 818 may be implemented using other memory types such as dynamic RAM (DRAM), synchronous DRAM (SDRAM), and the like. Additional devices may also be coupled to the bus 810, such as multiple CPUs and/or multiple system memories.

The MCH 814 may also include a graphics interface 820 coupled to a graphics accelerator 822. In some embodiments, the graphics interface 820 is coupled to the graphics accelerator 822 via an accelerated graphics port (AGP). In an embodiment, a display (such as a flat panel display) 840 may be coupled to the graphics interface 820 through, for example, a signal converter that translates a digital representation of an image stored in a storage device such as video memory or system memory into display signals that are interpreted and displayed by the display. The display 840 signals produced by the display device may pass through various control devices before being interpreted by and subsequently displayed on the display.

A hub interface 824 couples the MCH 814 to an input/output control hub (ICH) 826. The ICH 826 provides an interface to input/output (I/O) devices coupled to the computer system 800. The ICH 826 may be coupled to a peripheral component interconnect (PCI) bus. Hence, the ICH 826 includes a PCI bridge 828 that provides an interface to a PCI bus 830. The PCI bridge 828 provides a data path between the CPU 808 and peripheral devices. Additionally, other types of I/O interconnect topologies may be utilized such as the PCI Express□ architecture, available through Intel® Corporation of Santa Clara, Calif.

The PCI bus 830 may be coupled to an audio device 832 and one or more disk drive(s) 834. Other devices may be coupled to the PCI bus 830. In addition, the CPU 808 and the MCH 814 may be combined to form a single chip. Furthermore, the graphics accelerator 822 may be included within the MCH 814 in other embodiments. As yet another alternative, the MCH 814 and ICH 826 may be integrated into a single component, along with a graphics interface 820.

Additionally, other peripherals coupled to the ICH 826 may include, in various embodiments, integrated drive electronics (IDE) or small computer system interface (SCSI) hard drive(s), universal serial bus (USB) port(s), a keyboard, a mouse, parallel port(s), serial port(s), floppy disk drive(s), digital output support (e.g., digital video interface (DVI)), and the like. Hence, the computing device 802 may include volatile and/or nonvolatile memory.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and embodiments are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and embodiments are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and embodiments are not limited in this respect.

Figure 9:
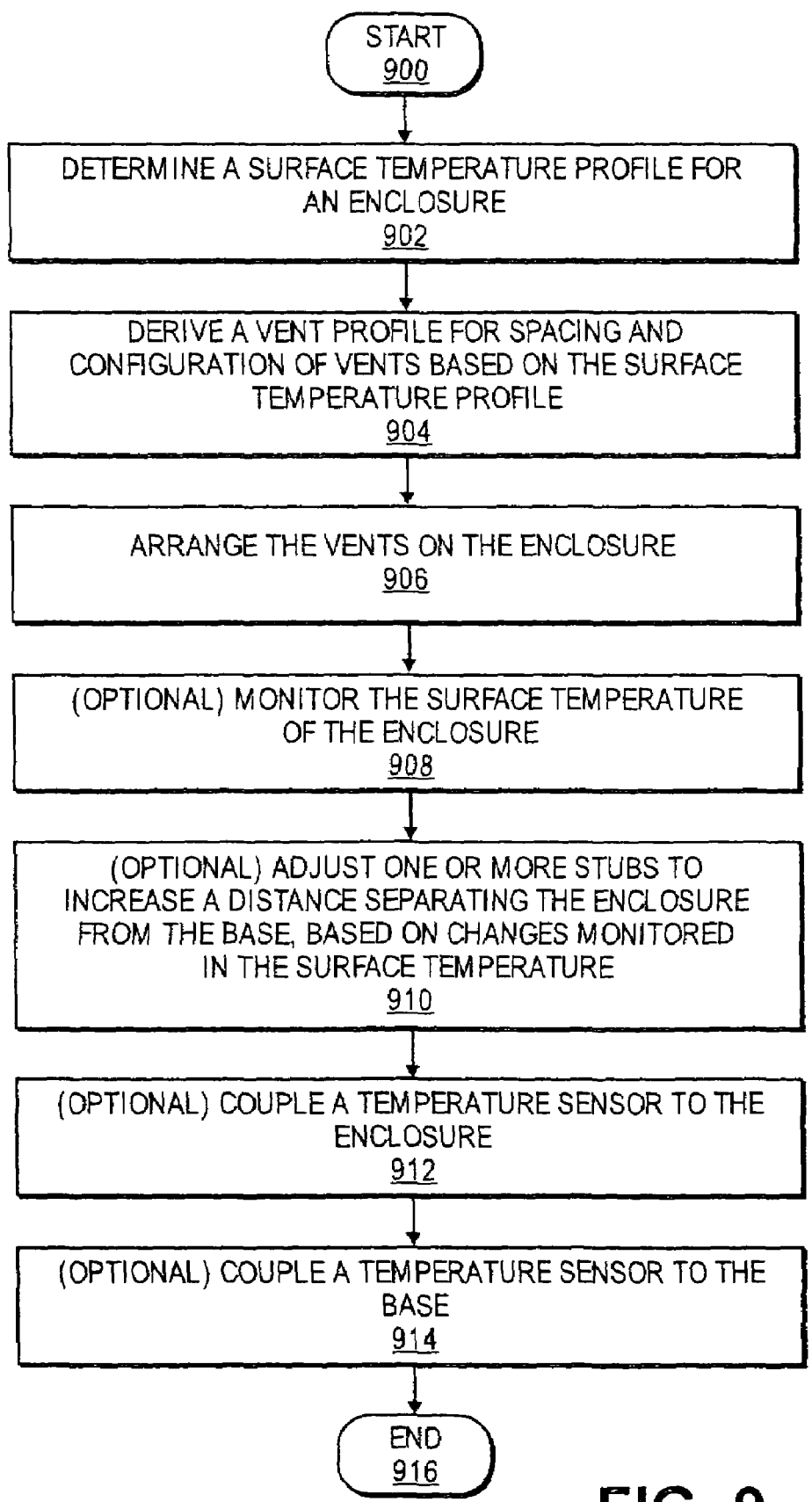
FIG. 9 is a flowchart for enclosure enhancement according to some embodiments of the invention.

Some of the methods described herein, such as, but not limited to FIG. 9, may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

FIG. 9 is a flowchart for enclosure enhancement according to some embodiments of the invention. The process may begin at 900 and proceed to 902, where it may determine a surface temperature profile for an enclosure. The process then proceeds to 904, where it may derive a vent profile for spacing and configuration of vents based on the surface temperature profile. The process then proceeds to 906, where it may arrange the vents on the enclosure.

In some embodiments of the invention, the process may proceed to 908, where it may monitor the surface temperature of the enclosure. Moreover, the process may then proceed to 910, where it may adjust one or more stubs to increase a distance separating the enclosure from a base based on changes monitored in the surface temperature. In some embodiments, the process may then proceed to 912, where it may couple a temperature sensor to the enclosure. The process may then proceed to 914, where it may couple a temperature sensor to a base. The process may then proceed to 916 where it ends and, as one of ordinary skill in the relevant art would appreciate based at least on the teachings provided herein, start again and operate any of the operations 902-914.

Embodiments of the invention may be described in sufficient detail to enable those skilled in the art to practice the invention. Other embodiments may be utilized, and structural, logical, and intellectual changes may be made without departing from the scope of the present invention. Moreover, it is to be understood that various embodiments of the invention, although different, are not necessarily mutually exclusive. For example, a particular feature, structure, or characteristic described in some embodiments may be included within other embodiments. Those skilled in the art can appreciate from the foregoing description that the techniques of the embodiments of the invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

What is claimed is:

1. An apparatus comprising:
    a base of a first composition, wherein the base is to make thermal contact with a component;
    an enclosure of a second composition in proximity with the base, wherein the second composition has a lower thermal conductivity than the first composition, the enclosure comprising a cover of a computing device;
    one or more stubs positioned between the base and the enclosure to separate the base from the enclosure; and
    an array of vents in the enclosure, wherein the vents are to provide for the transfer of thermal energy from the base to a fluid.

2. The apparatus of claim 1, wherein the component is capable of generating thermal energy.

3. The apparatus of claim 1, wherein the component is at least one of a processor, a chipset, a display, or a power adapter.

4. The apparatus of claim 1, wherein the fluid is at least one of air, water, ethylene, propylene, or glycol.

5. The apparatus of claim 1, wherein the base has higher thermal conductivity than the enclosure.

6. The apparatus of claim 1, wherein one or more vents of the array are integrally formed with the enclosure.

7. The apparatus of claim 1, wherein shapes of the vents are angled, curved, louvered, sinusoidal, flapped, corrugated, separated posts, a combination of these shapes, or a combination of variations of the same shape.

8. The apparatus of claim 1, wherein the one or more stubs are positioned to reduce the transfer of thermal energy from the base to the enclosure.

9. The apparatus of claim 1, wherein the one or more stubs are positioned to increase the separation of the base from the enclosure.

10. The apparatus of claim 1, wherein the base is at least one of a heat spreader or a heat sink.

* * * * *